(12) United States Patent
Kim et al.

(10) Patent No.: US 9,070,896 B2
(45) Date of Patent: Jun. 30, 2015

(54) ORGANIC LIGHT EMITTING DIODE DISPLAY

(71) Applicant: Samsung Display Co., Ltd., Yongin, Gyeonggi-Do (KR)

(72) Inventors: Ki-Wook Kim, Yongin (KR); Dae-Hyun Noh, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/856,308

(22) Filed: Apr. 3, 2013

(65) Prior Publication Data
US 2013/0320314 A1 Dec. 5, 2013

(30) Foreign Application Priority Data
Jun. 1, 2012 (KR) .......................... 10-2012-0059342

(51) Int. Cl.
*H01L 29/04* (2006.01)
*H01L 51/52* (2006.01)
*H01L 29/08* (2006.01)

(52) U.S. Cl.
CPC ...................................... *H01L 51/52* (2013.01)

(58) Field of Classification Search
CPC . H01L 27/32; H01L 27/3202; H01L 27/3204; H01L 27/3206; H01L 2227/32; H01L 2251/50; H01L 41/42
USPC ................. 257/40, 59, 72, E51.001, E21.018, 257/E21.022; 345/212, 204; 349/39, 38, 349/108
See application file for complete search history.

(56) References Cited

U.S. PATENT DOCUMENTS

| | | | |
|---|---|---|---|
| 4,759,610 A * | 7/1988 | Yanagisawa .................. | 349/162 |
| 7,710,019 B2 | 5/2010 | Jung et al. | |
| 7,915,689 B2 | 3/2011 | Cho et al. | |
| 7,948,173 B2 | 5/2011 | Choi et al. | |
| 7,986,095 B2 | 7/2011 | Rhee et al. | |
| 8,232,123 B2 | 7/2012 | Cho et al. | |
| 2002/0070381 A1 * | 6/2002 | Yamada et al. ................. | 257/59 |
| 2009/0174690 A1 | 7/2009 | Song et al. | |
| 2009/0261712 A1 | 10/2009 | Choi et al. | |
| 2010/0052517 A1 | 3/2010 | Kim | |
| 2010/0133990 A1 | 6/2010 | Park et al. | |
| 2010/0203687 A1 * | 8/2010 | Cho et al. ....................... | 438/151 |
| 2011/0114960 A1 * | 5/2011 | Lee et al. ......................... | 257/71 |
| 2011/0205198 A1 * | 8/2011 | Jeong et al. .................... | 345/205 |
| 2012/0049206 A1 | 3/2012 | Choi et al. | |
| 2012/0049215 A1 * | 3/2012 | Yoon et al. ..................... | 257/91 |
| 2012/0080681 A1 * | 4/2012 | Kim et al. ....................... | 257/59 |

(Continued)

FOREIGN PATENT DOCUMENTS

| | | |
|---|---|---|
| KR | 10-0659053 | 12/2006 |
| KR | 10-0834346 | 5/2008 |

(Continued)

*Primary Examiner* — Galina Yushina
(74) *Attorney, Agent, or Firm* — Robert E. Bushnell, Esq.

(57) ABSTRACT

An OLED display includes: a substrate; a first signal line provided on the substrate; a second signal line crossing the first signal line; a thin film transistor connected to the first signal line and the second signal line; a pixel electrode connected to a drain electrode of the thin film transistor; an emission layer formed on the pixel electrode; a common electrode formed on the emission layer and formed of a reflective material; and a capacitor overlapping the pixel electrode.

23 Claims, 10 Drawing Sheets

(56) References Cited

U.S. PATENT DOCUMENTS

2012/0091477 A1  4/2012  Kim
2012/0097965 A1* 4/2012  Shin et al. .................. 257/72
2012/0153814 A1  6/2012  Lee et al.
2012/0267611 A1* 10/2012 Chung et al. ................ 257/40

FOREIGN PATENT DOCUMENTS

KR    10-1073565      10/2011
KR    10-2012-0002141  1/2012

* cited by examiner

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 1 Jun. 2012 and there duly assigned Serial No. 10-2012-0059342.

BACKGROUND OF THE INVENTION

1. Field of the Invention

The present invention relates generally to an organic light emitting diode (OLED) display.

2. Description of the Related Art

An organic light emitting diode (OLED) display is a self emissive display device that displays images with organic light emitting diodes.

Unlike a liquid crystal display (LCD), the OLED display does not require an additional light source, and accordingly the thickness and weight thereof can be reduced. Furthermore, because the OLED display has high quality characteristics, such as low power consumption, high luminance, and high reaction speed, the OLED display is appropriate for use in a mobile electronic device.

Such an OLED display can be classified into a top-emission type and a bottom-emission type, and the bottom emission type has a more stable diode than the top emission type, but it has a lower aperture ratio than the top emission type.

The bottom emission type uses an area excluding a transistor, a capacitor, and a wire as a light emitting area. Among them, only when the capacitor has a predetermined capacity or more, the capacitor may maintain signal data of one frame and may be compensated, and it is difficult to decrease the size of the capacitor which occupies a large area.

Furthermore, thinning the capacitor causes short-circuit defective rate and process distribution to be increased.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide an OLED display having an aperture ratio which is increased without changing the size and shape of a capacitor.

Furthermore, the OLED display can improve light emission efficiency by realizing a resonance effect with a simple structure.

An OLED display according to an exemplary embodiment of the invention includes: a substrate; a first signal line provided on the substrate; a second signal line crossing the first signal line; a thin film transistor connected to the first signal line and the second signal line; a pixel electrode connected to a drain electrode of the thin film transistor; an emission layer formed on the pixel electrode; a common electrode formed on the emission layer and formed of a reflective material; and a capacitor overlapping the pixel electrode.

The capacitor may include a first capacitor electrode and a second capacitor electrode that overlap each other with reference to a dielectric material, and at least one of the first capacitor electrode and the second capacitor electrode may be formed of a transparent conductive material.

The pixel electrode may be formed of a transparent conductive material.

The first capacitor electrode may be connected to a semiconductor of the thin film transistor, and the second capacitor electrode may be connected to a gate electrode of the thin film transistor.

An OLED display according to another exemplary embodiment includes a plurality of pixels. Each pixel includes a capacitor connected to the thin film transistor and an emission unit controlled by the thin film transistor, and the emission unit includes a plurality of sub-emission units. At least one of the plurality of sub-emission units may be provided on the capacitor.

Each of the plurality of sub-emission units may include: a pixel electrode; an emission layer formed on the pixel electrode; and a common electrode formed on the emission layer.

The capacitor includes a first capacitor electrode and a second capacitor electrode that overlap each other with reference to a dielectric material, and the pixel electrode provided on the capacitor may be disposed within a boundary line of the capacitor.

At least one of the first capacitor electrode and the second capacitor electrode may be formed of a transparent conductive material.

The first capacitor electrode may be formed of the same material as a semiconductor of the thin film transistor.

The pixel electrode may be formed of a transparent material and the common electrode may be formed of a reflective material.

The OLED display may further include a semi-transparent layer overlapping at least one sub-pixel electrode.

An OLED display according to another exemplary embodiment includes: a substrate; a first signal line provided on the substrate; a second signal line crossing the first signal line; a thin film transistor connected to the first signal line and the second signal line; a first pixel electrode electrically connected to the thin film transistor; a second pixel electrode electrically connected to the first pixel electrode; an emission layer formed on the first pixel electrode and the second pixel electrode; and a common electrode formed on the emission layer.

The OLED display further includes a capacitor electrically connected to the thin film transistor, and the second pixel electrode may be provided on the capacitor.

The second pixel electrode may be disposed within a boundary line of the first or second capacitor electrode.

The first capacitor electrode may be connected to a semiconductor of the thin film transistor, and the second capacitor electrode may be connected to a capacitor line.

The second capacitor electrode may be formed of a transparent conductive material.

The first pixel electrode and the second pixel electrode may be formed of a transparent conductive material.

The first pixel electrode and the second pixel electrode may be connected to each other through a contact hole.

The first pixel electrode may be provided of the same layer of a gate electrode of the thin film transistor.

The first pixel electrode and the second pixel electrode may be provided of the same layer.

The OLED display may further include a semi-transparent layer provided between the first pixel electrode and the substrate.

The common electrode may be formed of a reflective material.

The OLED display according to the exemplary embodiment forms the sub-emission unit so that light emission efficiency of the OLED display can be increased.

In addition, as in the exemplary embodiment, light emission efficiency of the OLED display can be increased without increasing the size of the pixel by forming the sub-emission unit.

Furthermore, a sufficient amount of capacitance can be acquired without changing the size or shape of the capacitor for forming the sub-emission unit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
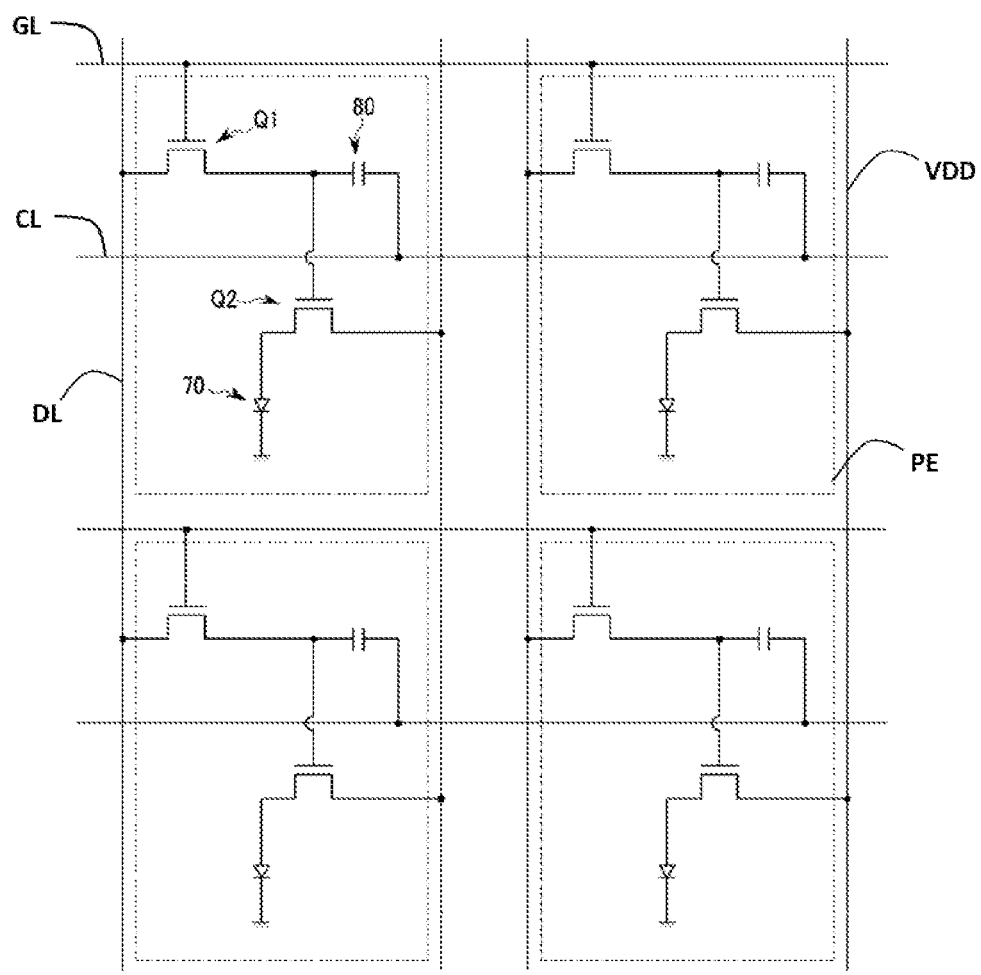
FIG. 1 is a portion of a circuit diagram of a plurality of pixels of an OLED display according to a first exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification. The size and thickness of the components shown in the drawings are optionally determined for better understanding and ease of description, and the present invention is not limited to the examples shown in the drawings.

It will be understood that, when an element such as a layer, film, region, or substrate is referred to as being "on" another element, it can be directly on the other element or intervening elements may also be present. Furthermore, in the specification and the claims that follow, when it is described that an element is "coupled" to another element, the element may be "directly coupled" to the other element or "electrically coupled" to the other element through a third element.

FIG. 1 is a circuit diagram of a pixel of an organic light emitting diode (OLED) display according to a first exemplary embodiment of the invention.

Referring to FIG. 1, a pixel PE of the OLED display according to the first exemplary embodiment of the invention has a 2Tr-1Cap structure with an organic light emitting diode 70, two thin film transistors (TFTs) Q1 and Q2, and a capacitor 80. However, the exemplary embodiment is not limited thereto. The OLED display may be variously structured so that three or more thin film transistors and two or more capacitors are provided in one pixel PE together with a separate wire. The additional thin film transistor and capacitors form a compensation circuit.

The compensation circuit improves the uniformity of the organic light emitting diode 70 formed at each pixel PE, and prevents the image quality from being deviated. The compensation circuit includes two to eight thin film transistors.

The organic light emitting diode 70 includes an anode, which is a hole injection electrode, a cathode, which is an electron injection electrode, and an organic emission layer provided between the anode and the cathode.

In the first exemplary embodiment, the pixel PE includes the first thin film transistor Q1 and the second thin film transistor Q2.

The first thin film transistor Q1 and the second thin film transistor Q2 respectively include gate electrodes, semiconductor layers, source electrodes and drain electrodes. In addition, a semiconductor of one of the first and second thin film transistors Q1 and Q2, respectively, includes a polysilicon doped with an impurity. That is, one of the first and second thin film transistors Q1 and Q2, respectively, is a polysilicon thin film transistor.

FIG. 1 illustrates a first signal line, a second signal line, a third signal line, and a fourth signal line, and various signals may be inputted to each of the signal lines, and a gate signal, a constant voltage, a data signal, and a capacitor voltage may be applied. For better understanding and ease of description, the first signal line is referred to as a gate line GL, the second signal line is referred to as a common power line VDD, the third signal line is referred to as a data line DL, and the fourth signal line is referred to as a capacitor line CL. The capacitor line CL may be omitted as necessary.

The data line DL is connected to a source electrode of the first thin film transistor (TFT) Q1, and the gate line GL is connected to a gate electrode of the first thin film transistor Q1. In addition, a drain electrode of the first thin film transistor Q1 is connected to the capacitor line CL through the capacitor 80. A node is formed between the drain electrode of the first thin film transistor Q1 and the capacitor 80, and thus a gate electrode of the second thin film transistor Q2 is connected thereto. In addition, the common power line VDD is connected to a source electrode of the second thin film transistor Q2, and an anode of the organic light emitting element 70 is connected to a drain electrode of the second thin film transistor Q2.

The first thin film transistor Q1 is used as a switch for selecting a pixel PE for light emission. The first thin film transistor Q1 is instantly turned on, and thus the capacitor 80 is charged, and the amount of charge charged in this case is proportional to a voltage applied from the data line DL. In addition, a voltage increasing signal is inputted to the capacitor line CL with one frame cycle while the first thin film transistor Q1 is in the turn-off state, a gate potential of the second thin film transistor Q2 is increased along with the voltage applied through the capacitor line CL, with reference to a potential charged in the capacitor 80. The second thin film transistor Q2 is turned on when the gate potential exceeds a threshold voltage Vt. Then, a voltage applied to the common power line VDD is applied to the organic light emitting element 70 through the second thin film transistor Q2, and the organic light emitting element 70 emits light.

The OLED display of FIG. 1 will now be described in further detail with reference to FIG. 2 to FIG. 4.

Figure 2:
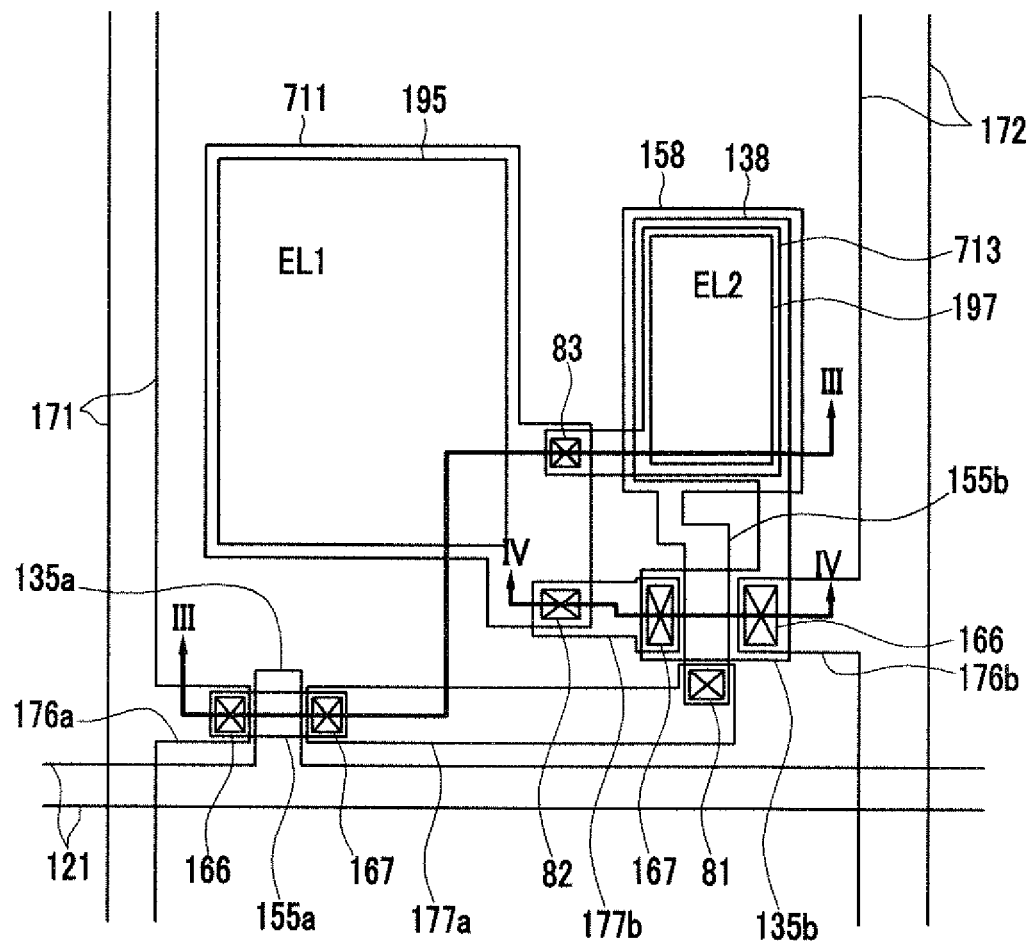
FIG. 2 is a layout view of one of the pixels of the OLED display according to the first exemplary embodiment of the invention.
Figure 3:
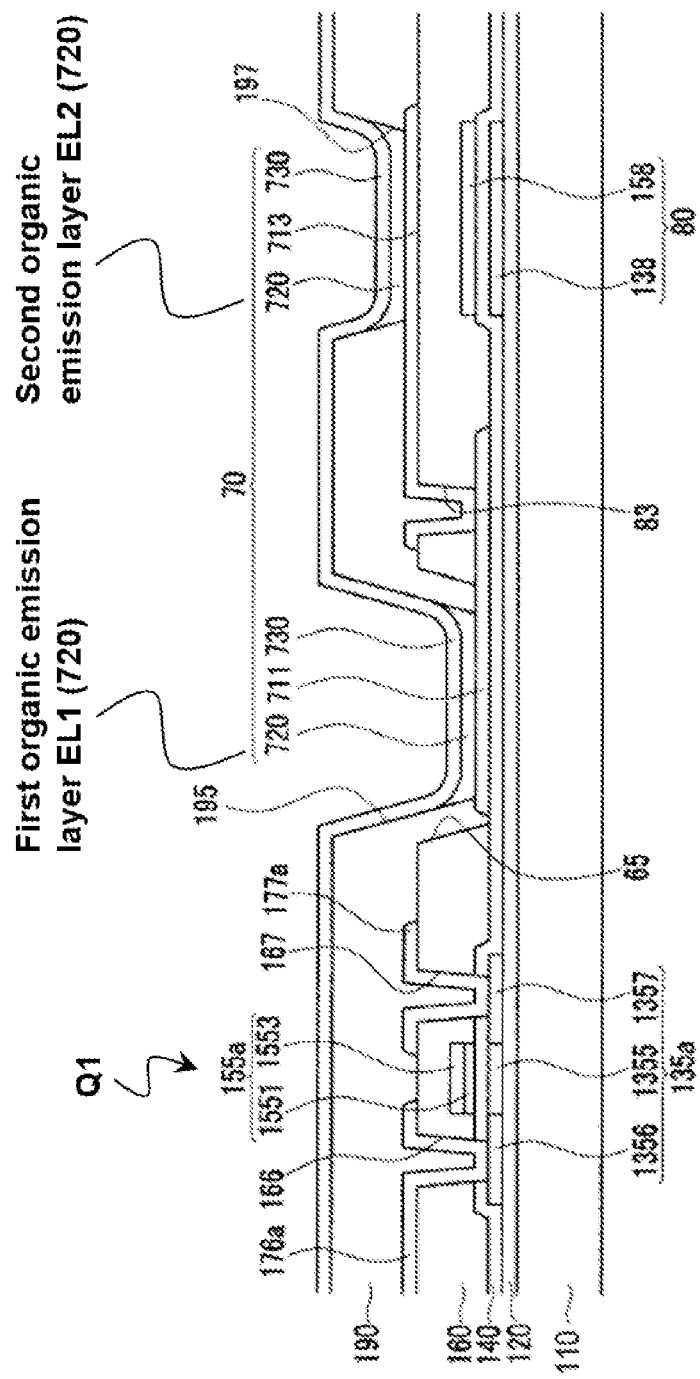
FIG. 3 is a cross-sectional view of FIG. 2, taken along the line III-III.
Figure 4:
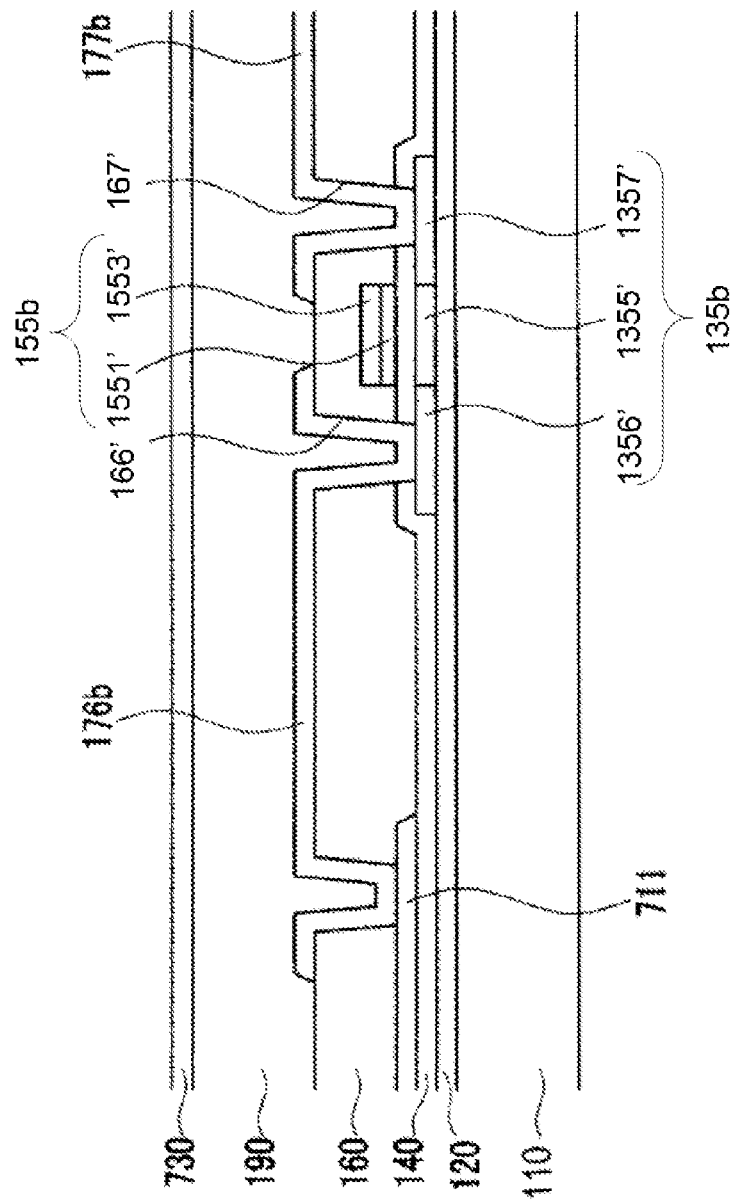
FIG. 4 is a cross-sectional view of FIG. 2, taken along the line IV-IV.

FIG. 2 is a layout view of a pixel of the OLED display according to the first exemplary embodiment, FIG. 3 is a cross-sectional view of FIG. 2, taken along the line III-III, and FIG. 4 is a cross-sectional view of FIG. 2, taken along the line IV-IV.

Referring to FIG. 2 to FIG. 4, the OLED display according to the first exemplary embodiment includes a substrate 110, and a buffer layer 120 is formed on the substrate 110 (see FIGS. 3 and 4).

The substrate 110 may be an insulating substrate formed of glass, quartz, ceramic, or plastic, or may be a metallic substrate formed of stainless steel.

The buffer layer 120 may have a single-layered structure of silicon nitride ($SiN_x$), or a double-layered structure of silicon nitride ($SiN_x$) and silicon oxide ($SiO_2$). The buffer layer 120 has a role of preventing unneeded components like impure elements or moisture from intruding into the target, while flattening the surface thereof at the same time.

First and second semiconductors 135a and 135b, respectively, formed of polycrystalline silicon, and a first capacitor electrode 138 are formed on the buffer layer 120 (see FIGS. 3 and 4).

Each of the first semiconductor 135a and the second semiconductor 135b is divided into a channel area 1355 or 1355', a source area 1356 or 1356', and a drain area 1357 or 1357'. The source area 1356 or 1356' and the drain area 1357 or 1357' are formed in both sides of the channel area 1355 or 1355'. The channel areas 1355 and 1355' of the first and second semiconductors 135a and 135b, respectively, are polysilicon not doped with an impurity, that is, intrinsic semiconductors. The source areas 1356 and 1356' and the drain areas 1357 and 1357' of the first and second semiconductors 135a and 135b, respectively, are polysilicon doped with a conductive impurity, that is, impurity semiconductors.

The first capacitor electrode 138 may be doped with a conductive impurity.

The impurity doped in the source area 1356 or 1356', the drain area 1357 or 1357', and the first capacitor electrode 138 may be one of a p-type impurity and an n-type impurity.

A gate insulating layer 140 is formed on the first semiconductor 135a, the second semiconductor 135b, and the first capacitor electrode 138.

The gate insulation layer 140 may be a single layer or a multiple layer including at least one of tetra ethyl ortho silicate (TEOS), silicon nitride, and silicon oxide.

A pixel electrode 711, a gate line 121, a second gate electrode 155b, and a second capacitor electrode 158 are formed on the gate insulating layer 140 (see FIGS. 2 through 4).

The gate line 121 is extended in a horizontal direction and transmits a gate signal, and includes a first gate electrode 155a protruding toward the first semiconductor 135a from the gate line 121 (see FIG. 2).

The first gate electrode 155a and the second gate electrode 155b respectively overlap the channel areas (1355 and 1355') (see FIGS. 3 and 4).

The first gate electrode 155a and the second gate electrode 155b are formed of a lower conductive layer 1551 or 1551' and an upper metal layer 1553 or 1533'. The lower conductive layer 1551 or 1551' is formed of a transparent conductive material such as indium tin oxide (ITO), indium zinc oxide (IZO), zinc oxide (ZnO), and the like, and the upper metal layer 1553 or 1533' may be formed of a single layer of a multiple layer of tungsten, molybdenum, aluminum, or an alloy thereof.

The second capacitor electrode 158 overlaps the first capacitor electrode 138 and is connected to the second gate electrode 155b (see FIGS. 2 and 4). The second capacitor electrode 158 may be formed of the same material as the lower conductive layer 1551 of the first gate electrode 155a.

The first capacitor electrode 138 and the second capacitor electrode 158 form the capacitor 80 using the gate insulating layer 140 as a dielectric material (see FIG. 3).

The first pixel electrode 711 is formed of a transparent conductive material that is the same material as the lower conductive layer 1551 of the first gate electrode 155a. The first pixel electrode 711 of FIGS. 2 through 4 is connected to the drain electrode of the second thin film transistor Q2 of FIG. 1, and thus becomes an anode of the organic light emitting element.

The first pixel electrode 711 and the gate electrodes 155a and 155b may be formed through the same process, and in this case, the first pixel electrode 711 may be located lower than the source electrode or the drain electrode.

An interlayer insulating layer 160 (see FIGS. 3 and 4) is formed on the gate line 121 (see FIG. 2) and the second gate electrode 155b (see FIG. 4). Like the gate insulating layer 140, the interlayer insulating layer 160 may be formed of tetra ethyl ortho silicate (TEOS), silicon nitride, or silicon oxide.

An opening 65 (see FIG. 3) exposing the first pixel electrode 711 is formed in the interlayer insulating layer 160. A source contact hole 166 and a drain contact hole 167 exposing the source area 1356 and the drain area 1357, respectively, are formed in the interlayer insulating layer 160 and the gate insulating layer 140 (see FIG. 3).

A data line 171 including a first source electrode 176a, a constant voltage line 172 including a second source electrode 176b, a first drain electrode 177a, a second drain electrode 177b, and a second pixel electrode 713 of FIG. 2 are formed on the interlayer insulating layer 160 of FIG. 3.

The data line 171 transmits a data signal and extends in a direction crossing the gate line 121 (see FIG. 2).

The constant voltage line 172 transmits a constant voltage, extends in the same direction as the data line 171, and is separated from the data line 171 (see FIG. 2).

The first source electrode 176a protrudes toward the first semiconductor 135a from the data line 171, and the second source electrode 176b protrudes toward the second semiconductor 135b from the constant voltage line 172. The first source electrode 176a and the second source electrode 176b are connected to the source region 1356 through the source contact hole 166 (see FIGS. 2 through 4).

The first drain electrode 177a faces the first source electrode 176a (see FIG. 3), the second drain electrode 177b faces the second source electrode 176b (see FIG. 4), and the first drain electrode 177a and the second drain electrode 177b are connected to the drain area 1357 (see FIGS. 3 and 4), respectively, through the drain contact hole 167.

The first drain electrode 177a is extended along the gate line 121, and is electrically connected to the second gate electrode 155b through a contact hole 81 (see FIG. 2).

The second drain electrode 177b is electrically connected to the first pixel electrode 711 through a contact hole 82 (see FIG. 2).

Like the first pixel electrode 711, the second pixel electrode 713 is formed of a transparent conductive material. However, the second pixel electrode 713 may be formed of an opaque conductive material. The data line 171, the constant voltage line 172, the first drain electrode 177a, and the second drain electrode 177b may be formed in a double layer (not shown) of a transparent conductive material and an opaque metal by forming the second pixel electrode 713 with a double layer of a transparent conductive material and a low-resistive metal, and then removing the low-resistive metal of the second pixel electrode 713 (see FIG. 2).

The second pixel electrode 713 is electrically connected to the first pixel electrode 711 through a contact hole 83, and thus becomes an anode of the organic light emitting element (see FIG. 2).

A pixel defining layer 190 is formed on the first source electrode 176a, the second source electrode 176b, the first drain electrode 177a, and the second drain electrode 177b (see FIG. 3).

The pixel defining layer 190 includes openings 195 and 197 exposing the first pixel electrode 711 and the second pixel electrode 713 (see FIG. 3). The pixel defining layer 190 may be formed to include a resin such as polyacrylates or polyimides and a silica-based inorganic material.

An organic emission layer 720 is formed on the openings 195 and 197 of the pixel defining layer 190 (see FIG. 3).

The organic emission layer 720 is formed as a multi-layer including one or more of a light emission layer, a hole injection layer (HIL), a hole transport layer (HTL), an electron transport layer (ETL), and an electron injection layer (EIL).

If the organic emission layer 720 includes all of them, the electron injection layer (FIG. 4) is disposed on the negative electrode 730 (FIG. 3), on which the electron transport layer, the organic emission layer, the hole transport layer, and the hole injection layer are then sequentially stacked.

A common electrode 730 is formed on the pixel defining layer 190 and the organic emission layer 720 (FIG. 3).

The common electrode 730 may be formed of a reflective layer including a reflective material, or of a semi-transparent layer.

The reflective material forming the reflective layer and the semi-transparent layer may be at least one of magnesium (Mg), silver (Ag), gold (Au), calcium (Ca), lithium (Li), chromium (Cr), and aluminum (Al), or an alloy thereof. The reflective layer and the semi-transparent layer are determined by the thickness of the reflective material, and the thickness of the semi-transparent layer may be less than 200 nm. Light transmittance is increased as the thickness is increased and decreased, but resistance is increased when the thickness is too thin.

The common electrode 730 of FIG. 3 becomes a cathode of the organic light emitting element. The first pixel electrode 711, the second pixel electrode 713, organic emission layer 720, and common electrode 730 form the organic light emitting element 70 of FIG. 3. A light emission unit that emits light in the organic light emitting element 70 includes a plurality of sub-emission units, and the plurality of sub-emission units include, for example, a sub-emission unit corresponding to the first pixel electrode 711 and a sub-emission unit corresponding to the second pixel electrode 713. In the exemplary embodiment, the first pixel electrode 711 and the second pixel electrode 713 are exemplarily described. In an OLED display including a plurality of capacitors, each of the plurality of capacitors may include a sub-emission unit.

As in the exemplary embodiment, when the second pixel electrode 713 overlapping the capacitor and then the light emission layer is formed, not only is a sub-emission unit EL1 formed by the first pixel electrode 711, but also a sub-emission unit EL2 is formed by the second pixel electrode 713 so that an aperture ratio of the OLED display is increased.

In the exemplary embodiment, at least one sub-emission unit is disposed so as to overlap with a capacitor electrode so that an increase in the size of the pixel for forming the second pixel electrode 713 may not be necessary. Furthermore, since variation of the size or thickness of the capacitor for forming the second pixel electrode 713 is not necessary, capacitance is not decreased.

Figure 5:
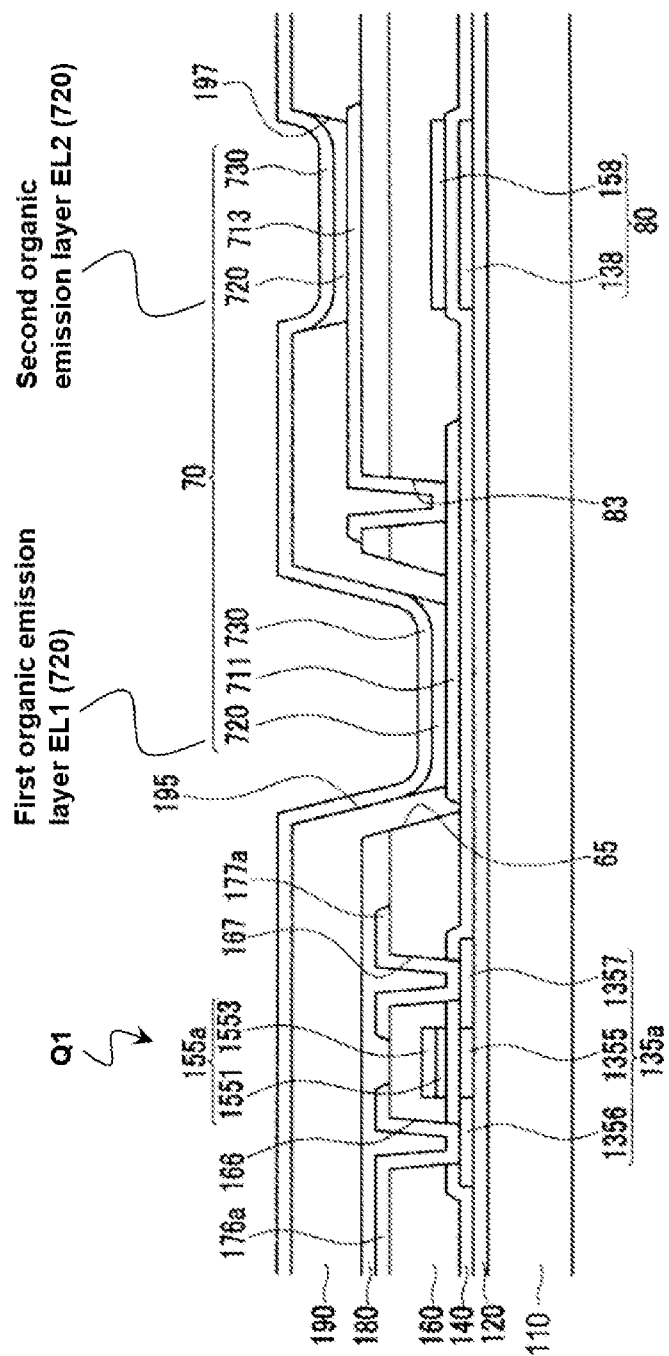
FIG. 5 is a cross-sectional view of an OLED display according to a second exemplary embodiment of the invention.

FIG. 5 is a cross-sectional view of an OLED display according to a second exemplary embodiment of the invention.

The OLED display of FIG. 5 is almost the same as the OLED display of FIG. 1 to FIG. 4, and therefore only different portions will be described in detail.

The OLED display of FIG. 5 includes a substrate 110, a buffer layer 120 formed on the substrate 110, a first semiconductor 135a and a second semiconductor (not shown) formed on the buffer layer 120, a first capacitor electrode 138, a gate insulating layer 140 formed on the first semiconductor layer 135a, the second semiconductor and the first capacitor electrode 138, a first gate electrode 155a, a second gate electrode (not shown), a second capacitor electrode 158 and a first pixel electrode 711 formed on the gate insulating layer 140, and an interlayer insulating layer 160 formed on the first pixel electrode 711, the first gate electrode 155a, the second gate electrode and the second capacitor layer 158, and including an opening 65.

In addition, a first drain electrode 177a, a second drain electrode (not shown), a data line (not shown), and a constant voltage line (not shown) are formed on the interlayer insulating layer 160, and an auxiliary interlayer insulating layer 180 is formed on the first drain electrode 177a, the second drain electrode, the data line, and the constant voltage line. A second pixel electrode 713 is formed on the auxiliary interlayer insulating layer 180.

In the present exemplary embodiment, when the auxiliary interlayer insulating layer 180 is formed, the drain electrode, the data line and the constant voltage line are covered by the auxiliary interlayer insulating layer 180 so that they can be prevented from being damaged due to exposure when the opening 64 and a contact hole 83 are formed.

The second pixel electrode 713 is electrically connected to the first pixel electrode 711 through the contact hole 83.

A pixel defining layer 190, including openings 195 and 197, is formed on the second pixel electrode 713, and the openings 195 and 197 expose the first pixel electrode 711 and the second pixel electrode 713, respectively.

In addition, an emission layer 720 is formed on the first pixel electrode 711 and the second pixel electrode 713, and a common electrode 730 is formed on the emission layer 720.

Figure 6:
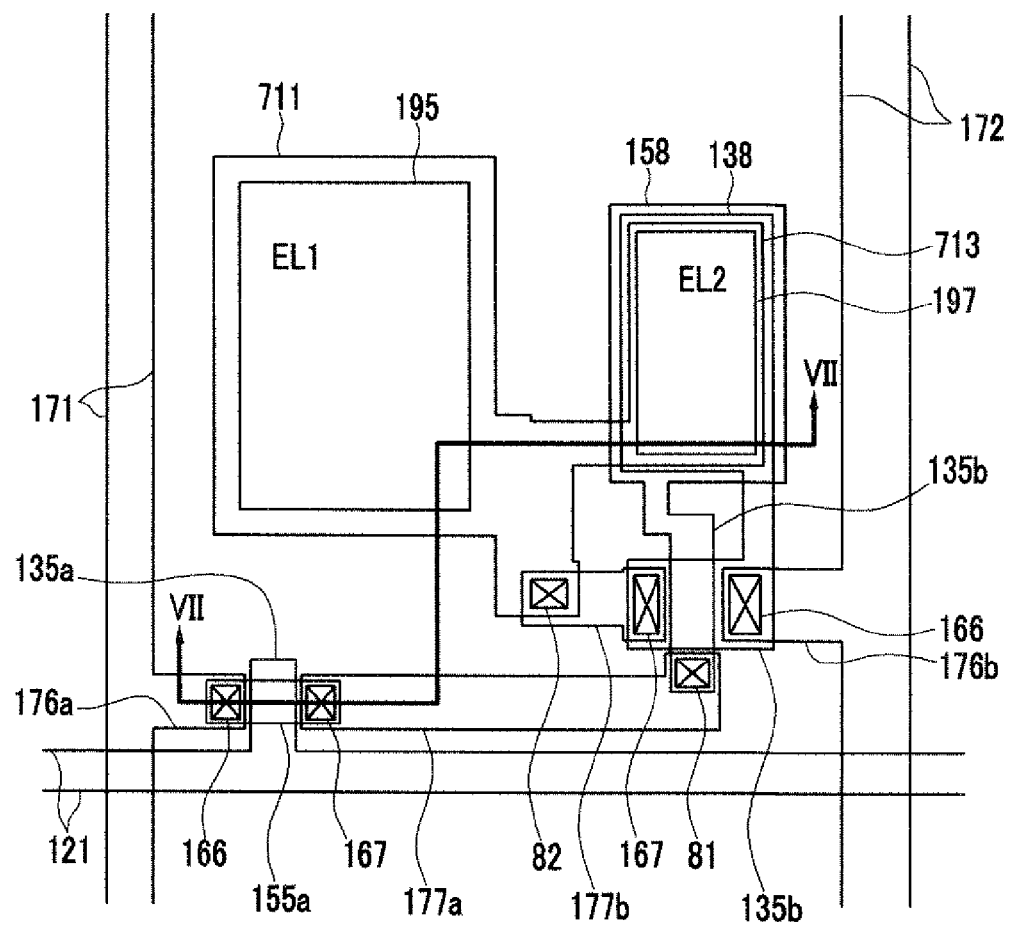
FIG. 6 is a layout view of one of the pixels of the OLED display according to the second exemplary embodiment of the invention.
Figure 7:
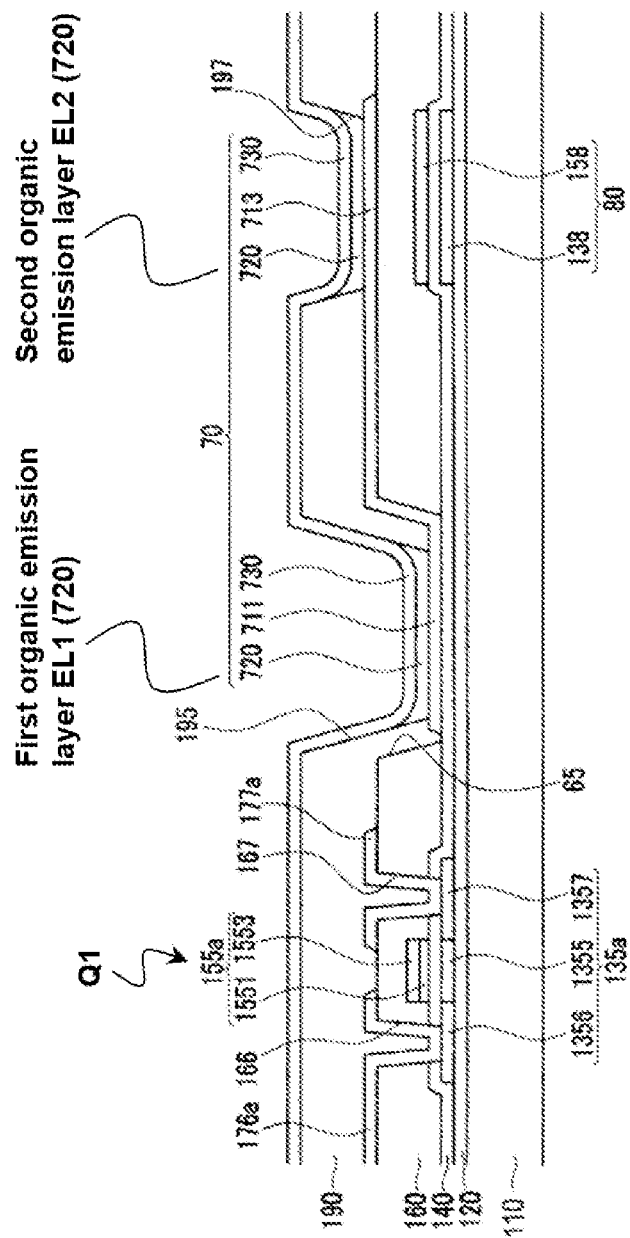
FIG. 7 is a cross-sectional view of FIG. 6, taken along the line VII-VII.
Figure 8:
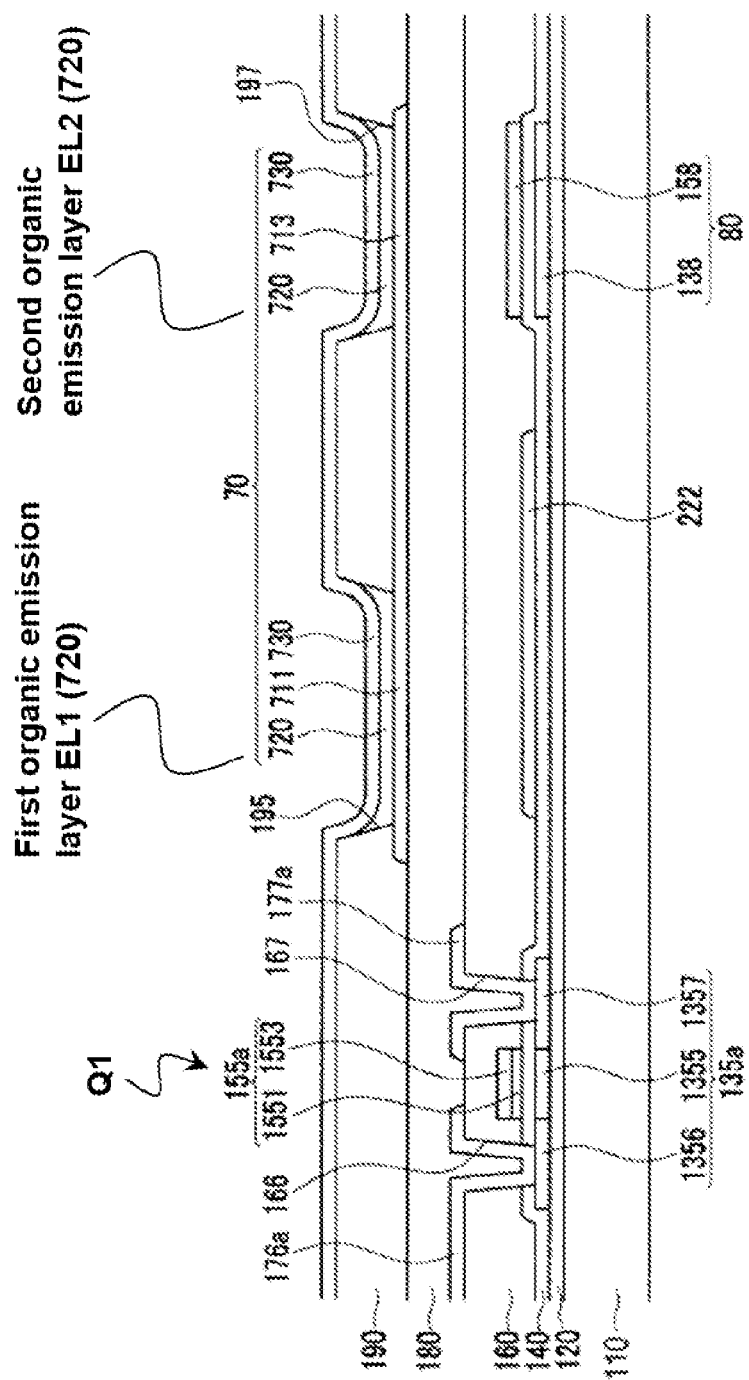
FIG. 8 is a cross-sectional view of an OLED display according to a third exemplary embodiment of the invention.

FIG. 6 is a layout view of a pixel of the OLED display according to the second exemplary embodiment of the invention, FIG. 7 is a cross-sectional view of FIG. 6, taken along the line VII-VII, and FIG. 8 is a cross-sectional view of an OLED display according to a third exemplary embodiment of the invention.

In the above-described exemplary embodiments, the first pixel electrode 711 and the second pixel electrode 713 are respectively formed and electrically connected to each other through a contact hole.

However, in the OLED display of FIG. 6 and FIG. 7, first and second pixel electrodes may be formed in the same layer.

That is, in the OLED display of FIG. 1 and FIG. 2, the pixel electrode 711 is formed before the data line, the constant voltage line, the first drain electrode, and the second drain electrode are formed. However, in the OLED display of FIG. 6 and FIG. 7, the data line, the constant voltage line, the first drain electrode, and the second drain electrode are formed, and then the first and second pixel electrodes 711 and 713, respectively, may be formed simultaneously by forming a transparent conductive layer and patterning the transparent conductive layer.

Accordingly, unlike the first and second pixel electrodes of the OLED display of FIG. 1 and FIG. 2, the first pixel electrode and the second pixel electrode of the OLED display of FIG. 6 and FIG. 7 can be electrically connected to each other without being connected through a contact hole.

Meanwhile, as shown in FIG. 8, the first pixel electrode 711 and the second pixel electrode 713 may be formed on the auxiliary interlayer insulating layer 180.

As shown in FIG. 8, unlike the exemplary embodiments of FIG. 1 to FIG. 7, when the first pixel electrode 711 and the second pixel electrode 713 are formed on the auxiliary interlayer insulating layer 180, a color path difference of the two sub-emission units can be reduced so that color reproducibility can be increased.

Furthermore, the OLED display may further include a semi-transparent layer 222 as shown in FIG. 8.

The semi-transparent layer 222 may be formed of the same material as lower conductive layers 1551 of the first gate electrode 155a and the second gate electrode (not shown). In addition, the semi-transparent layer 222 may be formed by controlling the thickness of the opaque metal so as to be thin.

In the exemplary embodiment, when the semi-transparent layer 222 of FIG. 8 is formed in the sub-emission unit EL1 of FIG. 6, the semi-transparent layer 222 functions as a metal mirror that realizes a resonance effect by a light reflection characteristic of the semi-transparent layer 222 together with the common electrode 730. That is, light generated from the organic emission layer 720 is reflected by the common electrode 730 and is then emitted to the outside through the pixel electrode 711 so that an image is realized, and a part of the light generated from the organic emission layer 270 is reflected back to the common electrode 730 by the first pixel electrode 711. Accordingly, the light generated from the organic emission layer 720 is partially captured between the first pixel electrode 711 and the common electrode 730 and resonated, and is then emitted to the output side, thereby realizing the resonance effect.

Furthermore, the sub-emission unit EL2, including the second pixel electrode, can acquire the same resonance effect of the sub-emission unit EL1, including the first pixel electrode, by means of the second capacitor electrode 158.

Figure 9:
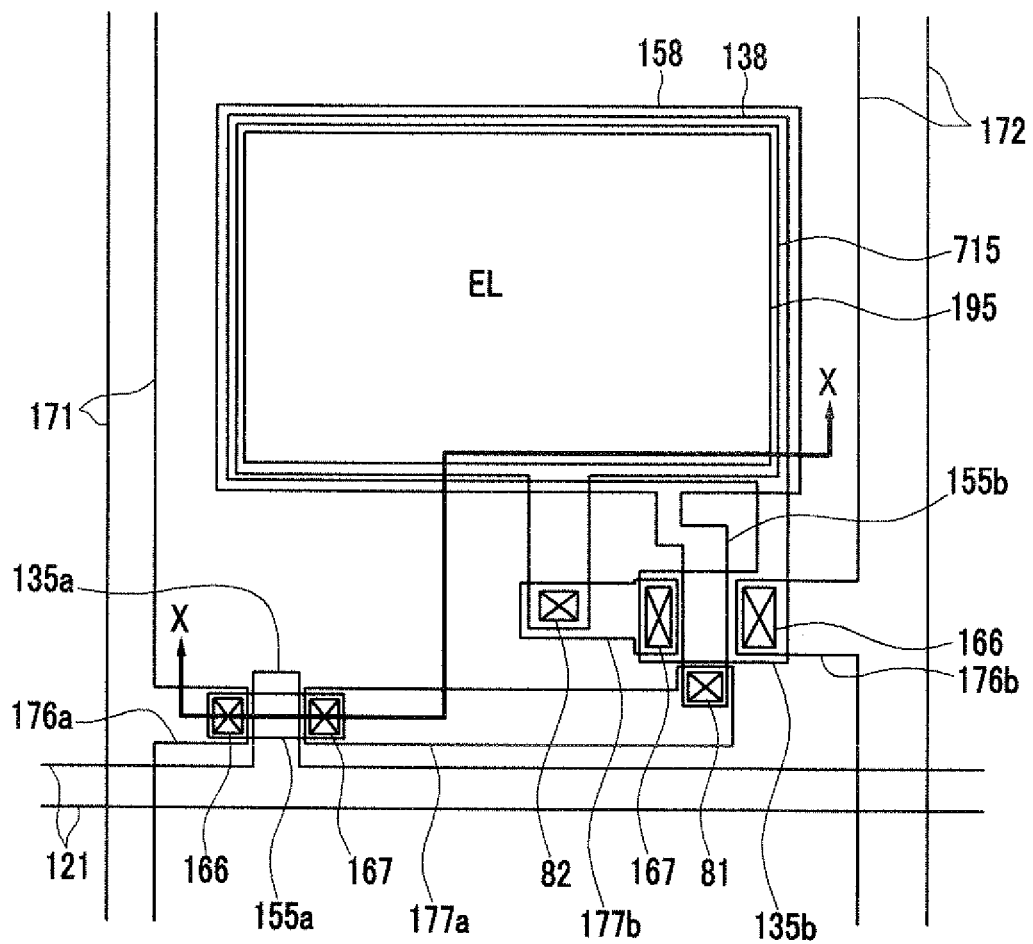
FIG. 9 is a layout view of one of the pixels of the OLED display according to the third exemplary embodiment of the invention.
Figure 10:
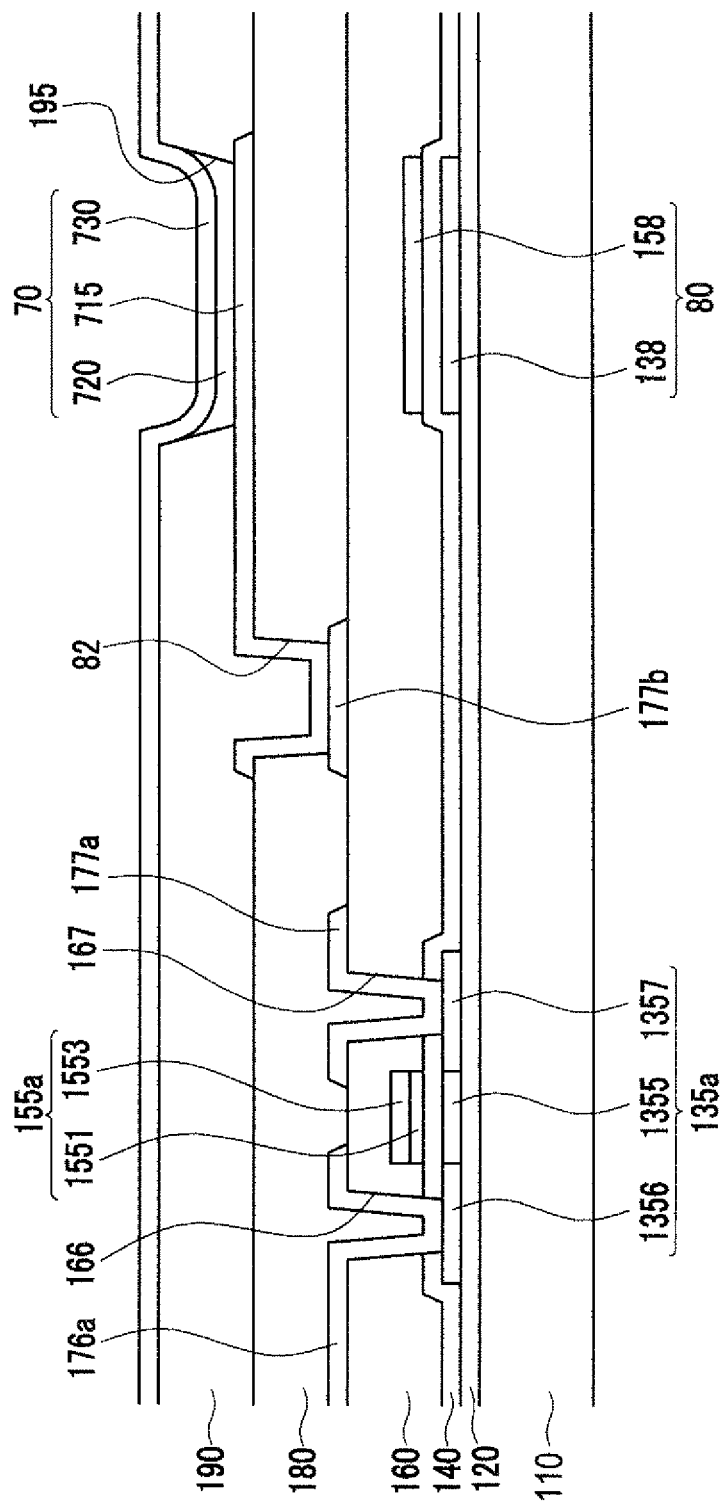
FIG. 10 is a cross-sectional view of FIG. 9, taken along the line X-X.

FIG. 9 is a layout view of a pixel of an OLED display according to the third exemplary embodiment of the invention, and FIG. 10 is a cross-sectional view of FIG. 9, taken along the line X-X.

As shown in FIG. 9 and FIG. 10, an OLED display includes a substrate 110, a buffer layer 120 formed on the substrate 110, a first semiconductor layer 135a and a second semiconductor layer (not shown) formed on the buffer layer 120, a first capacitor electrode 138, a first gate insulating layer 140 formed on the first semiconductor layer 135a, the second semiconductor layer and the first capacitor electrode 138, a first gate electrode 155a, a second gate electrode (not shown), a second capacitor electrode 158 formed on the gate insulating layer 140, and an interlayer insulating layer 160 formed on the second gate electrode, the second capacitor electrode 158, the first gate electrode 155a, the second gate electrode, and the second capacitor electrode 158, and including an opening 65.

In addition, a first drain electrode 177a, a second drain electrode 177b, a data line (not shown), and a constant voltage line (not shown) are formed on the interlayer insulating layer 160, and an auxiliary interlayer insulating layer 180 is formed on the first drain electrode 177a, the second drain electrode 177b, the data line, and the constant voltage line. A pixel electrode 715 is formed on the auxiliary interlayer insulating layer 180, and the pixel electrode 715 is electrically connected to the second drain electrode 177b through a contact hole 82.

A pixel defining layer 190, including an opening 195 that exposes the pixel electrode 715, is formed on the pixel electrode 715, an emission layer 720 is formed on the pixel electrode 715 exposed by the opening 195, and a common electrode 730 is formed on the emission layer 720.

As described, unlike in the exemplary embodiments of FIG. 1 to FIG. 8, the OLED display of FIG. 9 and FIG. 10 may include one emission unit EL. In this case, the emission unit EL is formed so as to overlap a capacitor 80 so that an aperture ratio of the OLED display can be increased.

In addition, a resonance effect can be expected from an electrode of the capacitor without forming an additional semi-transparent layer, or the resonance effect may be induced by additionally forming a semi-transparent layer under the pixel electrode as shown in FIG. 8.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
    a substrate;
    a first signal line provided on the substrate;
    a second signal line crossing the first signal line;
    a thin film transistor connected to the first signal line and the second signal line;
    first and second pixel electrodes connected to a drain electrode of the thin film transistor;
    a first emission layer formed on the first pixel electrode, a second emission layer formed on the second pixel electrode;
    a common electrode formed on the first emission layer and second emission layer and comprising a reflective material; and
    the second pixel electrode and a majority of a surface of the second emission layer overlapping a capacitor.

2. The OLED display device of claim 1, wherein the capacitor comprises a first capacitor electrode and a second capacitor electrode that overlap each other with reference to a dielectric material; and
    wherein at least one of the first capacitor electrode and the second capacitor electrode is formed of a transparent conductive material.

3. The OLED display device of claim 2, wherein the pixel electrodes are formed of a transparent conductive material.

4. The OLED display device of claim 2, wherein the first capacitor electrode is connected to a semiconductor of the thin film transistor, and the second capacitor electrode is connected to a capacitor line.

5. An organic light emitting diode (OLED) display device comprising a plurality of pixels, wherein each pixel includes:
    a capacitor connected to a thin film transistor; and
    an emission unit controlled by the thin film transistor;
    wherein the emission unit comprises a plurality of sub-emission units and each of the plurality of sub-emission units is electrically connected to the thin film transistor, a majority of a surface of one of the plurality of sub-emission units bounded by a pixel defining layer overlapping the capacitor.

6. The OLED display device of claim 5, wherein at least one of the plurality of sub-emission units is provided on the capacitor.

7. The OLED display device of claim 6, wherein each of the plurality of sub-emission units comprises:
   a pixel electrode;
   an emission layer formed on the pixel electrode; and
   a common electrode formed on the emission layer.

8. The OLED display device of claim 7, wherein the capacitor comprises a first capacitor electrode and a second capacitor electrode that overlap each other with reference to a dielectric material, and wherein the pixel electrode provided on the capacitor is disposed to overlap a portion within a boundary line of an adjacent surface of the capacitor.

9. The OLED display device of claim 8, wherein at least one of the first capacitor electrode and the second capacitor electrode is formed of a transparent conductive material.

10. The OLED display device of claim 9, wherein the first capacitor electrode is formed of a same material as a semiconductor of a thin film transistor.

11. The OLED display device of claim 7, wherein the pixel electrode is formed of a transparent material and the common electrode is formed of a reflective material.

12. The OLED display device of claim 5, further comprising a semi-transparent layer overlapping at least one pixel electrode.

13. An organic light emitting diode (OLED) display device, comprising:
   a substrate;
   a first signal line provided on the substrate;
   a second signal line crossing the first signal line;
   a thin film transistor connected to the first signal line and the second signal line;
   a first pixel electrode electrically connected to the thin film transistor;
   a second pixel electrode electrically connected to the first pixel electrode;
   an emission layer formed on the first pixel electrode and the second pixel electrode;
   a common electrode formed on the emission layer; and
   a capacitor electrically connected to the thin film transistor;
   the second pixel electrode is provided on the capacitor;
   a majority of a surface of the emission layer bounded by a pixel defining layer overlapping a capacitor.

14. The OLED display device of claim 1, the capacitor is electrically connected to the thin film transistor and the second pixel electrode is provided on the capacitor.

15. The OLED display device of claim 13, wherein the second pixel electrode is disposed within a boundary line of an adjacent surface of one of the first capacitor electrode and the second capacitor electrode.

16. The OLED display device of claim 15, wherein the first capacitor electrode is connected to a semiconductor of the thin film transistor, and the second capacitor electrode is connected to a capacitor line.

17. The OLED display device of claim 16, wherein the second capacitor electrode is formed of a transparent conductive material.

18. The OLED display device of claim 13, wherein the first pixel electrode and the second pixel electrode are formed of a transparent conductive material.

19. The OLED display device of claim 18, wherein the first pixel electrode and the second pixel electrode are connected to each other through a contact hole.

20. The OLED display device of claim 19, wherein the first pixel electrode is provided of a same layer as a gate electrode of the thin film transistor is provided.

21. The OLED display device of claim 18, wherein the first pixel electrode and the second pixel electrode are provided of a same layer.

22. The OLED display device of claim 21, further comprising a semi-transparent layer provided between the first pixel electrode and the substrate.

23. The OLED display device of claim 13, wherein the common electrode is formed of a reflective material.

* * * * *